(12) United States Patent
Unno et al.

(10) Patent No.: US 11,956,863 B2
(45) Date of Patent: Apr. 9, 2024

(54) MULTI-ZONE HEATER

(71) Applicant: NGK INSULATORS, LTD., Nagoya (JP)

(72) Inventors: Yutaka Unno, Handa (JP); Nobuyuki Kondou, Chita-County (JP)

(73) Assignee: NGK INSULATORS, LTD., Nagoya (JP)

( * ) Notice: Subject to any disclaimer, the term of this patent is extended or adjusted under 35 U.S.C. 154(b) by 895 days.

(21) Appl. No.: 17/005,745

(22) Filed: Aug. 28, 2020

(65) Prior Publication Data

US 2020/0396801 A1 Dec. 17, 2020

Related U.S. Application Data

(63) Continuation of application No. PCT/JP2019/008815, filed on Mar. 6, 2019.

(30) Foreign Application Priority Data

Mar. 23, 2018 (JP) .................. 2018-055520

(51) Int. Cl.
*H05B 3/26* (2006.01)
*C23C 16/46* (2006.01)
(Continued)

(52) U.S. Cl.
CPC .............. *H05B 3/265* (2013.01); *C23C 16/46* (2013.01); *C23C 16/50* (2013.01);
(Continued)

(58) Field of Classification Search
CPC ........ H05B 2203/016; H05B 2203/005; H05B 2203/002; H05B 1/0233; H05B 3/265; H01J 2237/3321; H01J 37/32522
(Continued)

(56) References Cited

U.S. PATENT DOCUMENTS

2003/0075537 A1* 4/2003 Okajima .................. H05B 3/68
219/468.1
2003/0173349 A1   9/2003 Unno et al.
(Continued)

FOREIGN PATENT DOCUMENTS

JP    2003-133195 A1    5/2003
JP    2003-272805 A1    9/2003
(Continued)

OTHER PUBLICATIONS

International Search Report and Written Opinion (Application No. PCT/JP2019/008815) dated May 21, 2019.
(Continued)

*Primary Examiner* — Phuong T Nguyen
(74) *Attorney, Agent, or Firm* — BURR PATENT LAW, PLLC

(57) ABSTRACT

A multi-zone heater includes an outer circumferential zone heater and first and second elemental wire portions. The outer circumferential zone heater is a coil that is provided in an outer circumferential zone of a ceramic substrate in the same plane as a plane in which a central zone heater is provided and that is routed throughout the outer circumferential zone in a unicursal manner from one end portion to the other end portion in the outer circumferential portion. The first elemental wire portion extends from a first terminal, passes through a central portion, is connected to the one end portion of the outer circumferential zone heater, and has a meandering shape in plan view. The second elemental wire portion extends from a second terminal, passes through the central portion, is connected to the other end portion of the outer circumferential zone heater, and has a meandering shape in plan view.

8 Claims, 5 Drawing Sheets

(51) Int. Cl.
  *C23C 16/50* (2006.01)
  *H01J 37/32* (2006.01)
  *H05B 1/02* (2006.01)

(52) U.S. Cl.
  CPC . *H01J 37/32522* (2013.01); *H01J 2237/3321* (2013.01); *H05B 1/0233* (2013.01); *H05B 2203/002* (2013.01); *H05B 2203/005* (2013.01); *H05B 2203/016* (2013.01)

(58) Field of Classification Search
  USPC ............................................ 219/444.1, 468.1
  See application file for complete search history.

(56) References Cited

U.S. PATENT DOCUMENTS

| | | | |
|---|---|---|---|
| 2003/0183616 A1* | 10/2003 | Goto | H05B 3/748 219/468.1 |
| 2005/0173411 A1 | 8/2005 | Goto | |
| 2008/0302781 A1* | 12/2008 | Murakami | C23C 16/4586 219/444.1 |
| 2018/0254204 A1 | 9/2018 | Jung et al. | |

FOREIGN PATENT DOCUMENTS

| | | |
|---|---|---|
| JP | 2004-006242 A1 | 1/2004 |
| JP | 2005-197074 A1 | 7/2005 |
| JP | 3897563 B2 | 3/2007 |
| KR | 10-0870776 B1 | 11/2008 |
| KR | 10-2017-0040617 A | 4/2017 |
| TW | 575934 B | 2/2004 |

OTHER PUBLICATIONS

Taiwanese Office Action (Application No. 108108399) dated Oct. 4, 2022.
Korean Third Party Submission (Application No. 10-2020-7026438) dated Mar. 3, 2022.
English translation of the International Preliminary Report on Patentability (Chapter 1) (Application No. PCT/JP2019/008815) dated Oct. 8, 2020.

* cited by examiner

US 11,956,863 B2

MULTI-ZONE HEATER

BACKGROUND OF THE INVENTION

1. Field of the Invention

The present invention relates to a multi-zone heater.

2. Description of the Related Art

In semiconductor manufacturing apparatuses, ceramic heaters for heating wafers are adopted. As such ceramic heaters, so-called two-zone heaters are known. As an example of such two-zone heaters, a two-zone heater is known. In this two-zone heater, as disclosed in PTL 1, a central zone heater and an outer circumferential zone heater are embedded in the same plane in a ceramic substrate, and voltage is independently applied to the zone heaters so as to independently control heat generation by the zone heaters. Each of the zone heaters includes a coil. Two terminals of the outer circumferential zone heater are provided in a central portion of the ceramic substrate. Each of the terminals is connected to the outer circumferential zone heater through a conductive connection portion. The conductive connection portion is formed so as to extend from the terminal, pass through the central portion, and reach an outer circumferential portion. Since the temperature around the conductive connection portion tends to be comparatively reduced in the central portion, PTL 1 proposes that the amount of heat generation of the coils per unit area is increased around the conductive connection portion.

CITATION LIST

Patent Literature

PTL 1: Japanese Patent No. 3897563

SUMMARY OF THE INVENTION

When the conductive connection portion is formed by a coil, the coil may generate heat and influence temperature control for the central portion with the central zone heater. In contrast, when the conductive connection portion is formed by an elemental wire (wire), the heat generation amount is small, and accordingly, the conductive connection portion does not significantly influence the temperature control for the central portion with the central zone heater. However, when the conductive connection portion is an elemental wire, a cool spot or hot spot may be generated around the conductive connection portion in the case where, for example, the power ratio between the central zone heater and the outer circumferential zone heater is varied or power supplied to both the zone heaters increases or reduces due to a change in a set temperature. Meanwhile, when a ceramic heater is used in an environment in which a heat cycle is repeatedly generated, the difference in thermal expansion occurs between the ceramic substrate and the coil embedded in a ceramic substrate. However, when the elemental wire has a linear shape, the difference in thermal expansion is not sufficiently absorbed. Thus, the ceramic substrate may be damaged by thermal stress generated at both ends of the elemental wire.

The present invention is made to solve the problem as described above, and a main object of the present invention is to prevent generation of cool spot or hot spot when a use environment is changed and prevent damage to a heater.

A multi-zone heater of the present invention includes:
a disc-shaped ceramic substrate that has a wafer placement surface;
a coil-shaped or mesh-shaped central zone heater provided in a central portion of the ceramic substrate;
at least one coil-shaped or mesh-shaped outer circumferential zone heater that is provided so as to correspond to at least one outer circumferential zone in an outer circumferential portion of the ceramic substrate in a same plane as a plane in which the central zone heater is disposed and that is routed throughout the at least one outer circumferential zone in a unicursal manner from one end portion to the other end portion in the at least one outer circumferential zone;
a first elemental wire portion that extends from a first terminal disposed in the central portion of the ceramic substrate, that passes through the central portion, that is connected to the one end portion of the at least one outer circumferential zone heater, and that has a meandering shape in plan view; and
a second elemental wire portion that extends from a second terminal disposed in the central portion of the ceramic substrate, that passes through the central portion, that is connected to the other end portion of the at least one outer circumferential zone heater, and that has a meandering shape in plan view.

In this multi-zone heater, voltage is independently applied to each of the zone heaters so as to allow independent control of heat generation by the zone heater. Both the first elemental wire portion that extends from the first terminal in the central portion, passes through the central portion, and is connected to the one end portion of the at least one outer circumferential zone heater and the second elemental wire portion that extends from the second terminal in the central portion, passes through the central portion, and is connected to the other end portion of the at least one outer circumferential zone heater are element wires (that is, having a wire shape) that have neither a coil shape nor wire shape. Accordingly, the heat generation amount of the first and second elemental wire portions is small, and neither the first elemental wire portion nor the second elemental wire portion interfere with the temperature control for the central portion of the ceramic substrate with the central zone heater. Meanwhile, each of the first and second elemental wire portions has a meandering shape in plan view. Thus, the heat generation amount can be increased by forming the first and second elemental wire portions in a curved shape at a position where a cool spot is likely to be generated due to changes in the use environment, and the heat generation amount can be suppressed by forming the first and second elemental wire portions in a linear shape at a position where a hot spot is likely to be generated by the changes in the use environment. Also, when the multi-zone heater is used in an environment in which a heat cycle is repeatedly generated, the difference in thermal expansion occurs between the ceramic substrate and the heaters embedded in the ceramic substrate. However, since the first and second elemental wire portions have a meandering shape, the difference in thermal expansion is absorbed. This reduces thermal stress generated at both ends of each of the first and second elemental wire portions. Thus, the multi-zone heater according to the present invention can prevent generation of a cool spot or hot spot when the use environment is changed and prevent damage to the ceramic substrate.

In the multi-zone heater according to the present invention, the first elemental wire portion and the second elemental wire portion may have respective parts where the first elemental wire portion and the second elemental wire portion are close to each other, and the first elemental wire portion and the second elemental wire portion may have respective parts where the first elemental wire portion and the second elemental wire portion are spaced from each other. The first and second elemental wire portions are disposed close to each other so as to increase the heat generation amount at a position where a cool spot is likely to be generated due to changes in the use environment, and the first and second elemental wire portions are spaced from each other so as to suppress the heat generation amount at a position where a hot spot is likely to be generated by changes in the use environment. This further facilitates prevention of generation of a cool spot or hot spot due to changes in the use environment.

In the multi-zone heater according to the present invention, the first elemental wire portion and the second elemental wire portion may each have a plurality of curved portions. Thus, the heat generation amount around each of the elemental wire portions can be finely varied compared to the case where the elemental wire portions each have a single curved portion.

In the multi-zone heater according to the present invention, the at least one outer circumferential zone may include a plurality of outer circumferential zones in the outer circumferential portion of the ceramic substrate. Thus, heat generation by the outer circumferential zone heater provided in each of the outer circumferential zones can be independently controlled, and accordingly, the temperature of the outer circumferential portion can be precisely controlled.

In the multi-zone heater according to the present invention, resistance per unit length of the first elemental wire portion and the second elemental wire portion may be smaller than resistance per unit length of the at least one outer circumferential zone heater. Thus, the heat generation amount per unit length of the first elemental wire portion and the second elemental wire portion can be smaller than the heat generation amount per unit length of the at least one outer circumferential zone heater or the plurality of outer circumferential zone heaters. For example, the wire diameter of the first elemental wire portion and the second elemental wire portion may be greater than that of the at least one outer circumferential zone heater or the plurality of outer circumferential zone heaters.

DETAILED DESCRIPTION OF THE INVENTION

Figure 1:
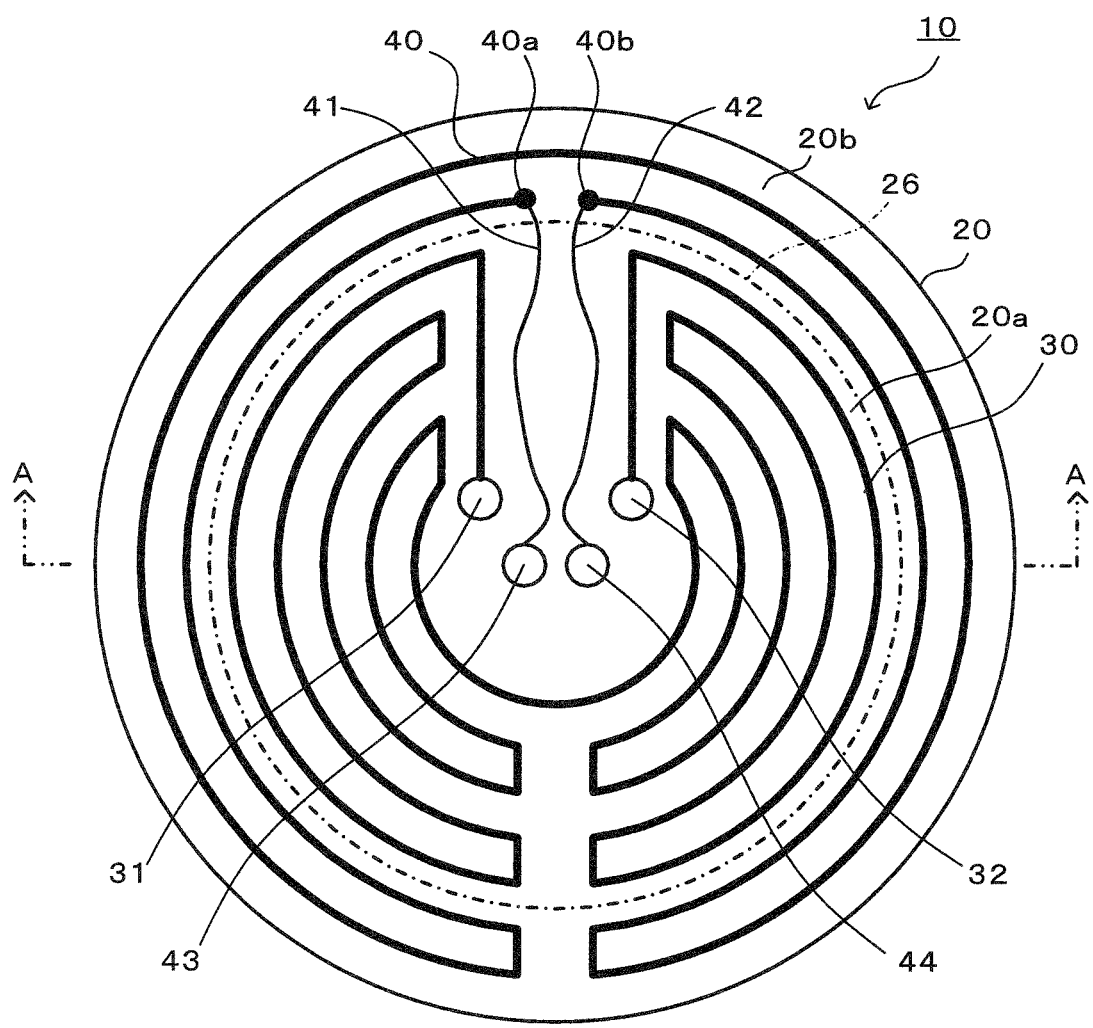
FIG. 1 is a plan view of a multi-zone heater 10.
Figure 2:
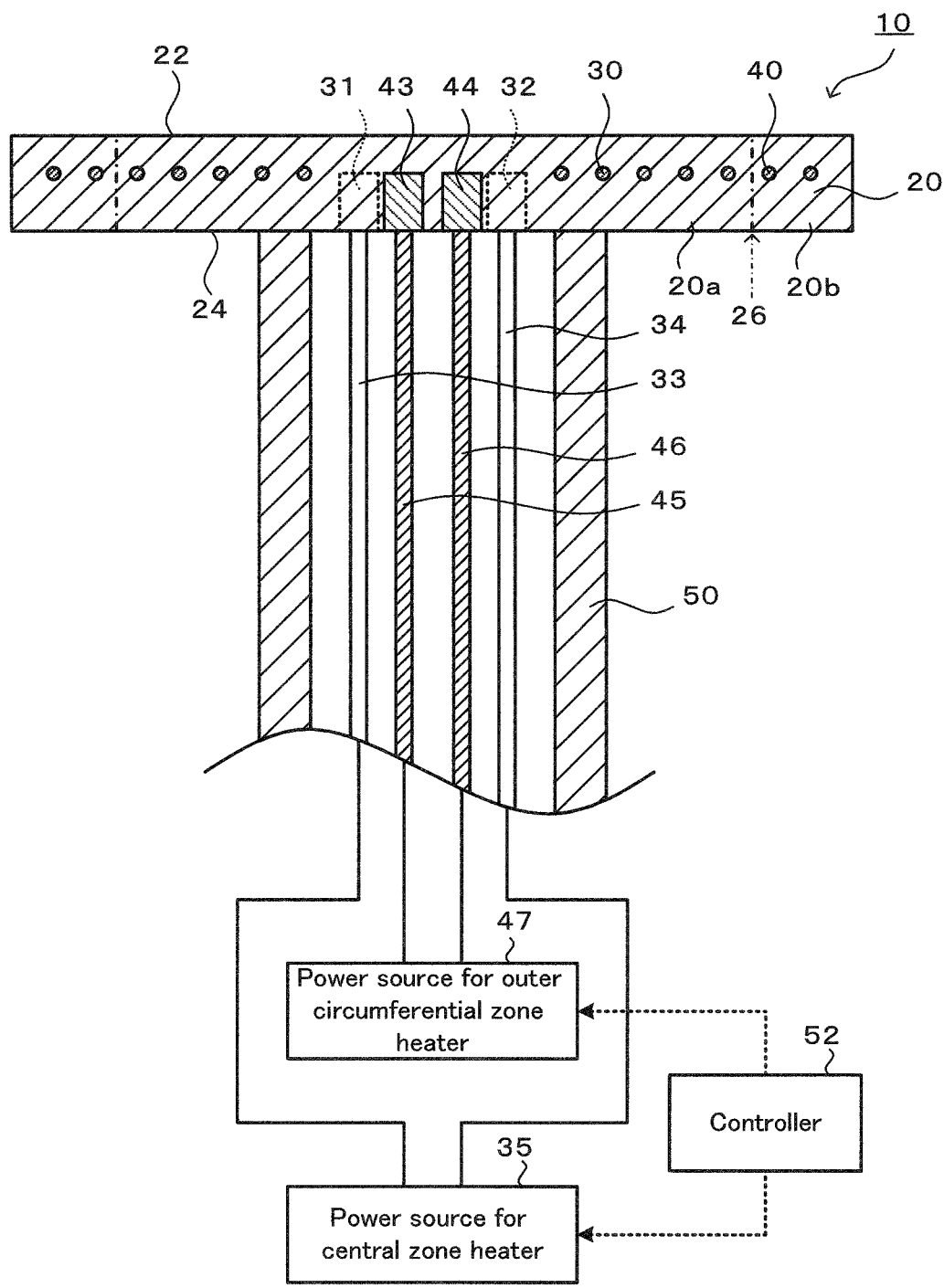
FIG. 2 is sectional view of FIG. 1 taken along line A-A illustrated in FIG. 1.
Figure 3:
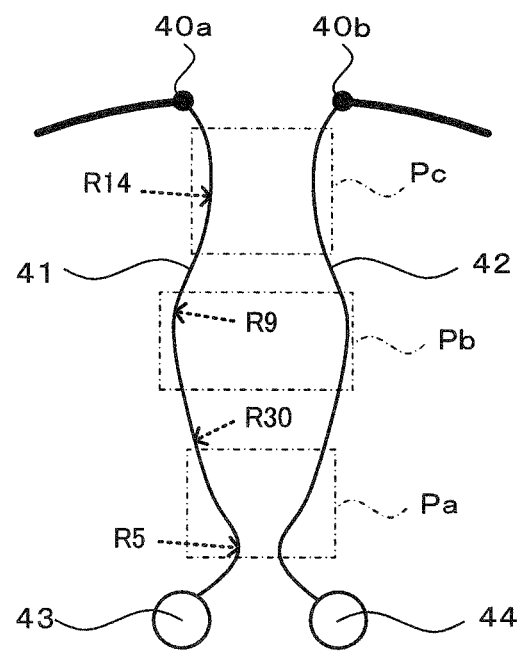
FIG. 3 is an explanatory view of first and second elemental wire portions 41, 42.

A preferred embodiment of the present invention is described below with reference to the drawings. FIG. 1 is a plan view of a multi-zone heater 10. FIG. 2 is sectional view of FIG. 1 taken along line A-A illustrated in FIG. 1. FIG. 3 is an explanatory view of first and second elemental wire portions 41, 42. Since FIG. 1 is a plan view of the multi-zone heater 10, members embedded in the multi-zone heater 10 (such as a central zone heater 30 and an outer circumferential zone heater 40) should be indicated by hidden lines (dotted lines). However, for convenience of description, such members are indicated by solid lines.

The multi-zone heater 10 is used as a table for heating a semiconductor wafer in a manufacturing process of semiconductor devices. The multi-zone heater 10 includes a disc-shaped ceramic substrate 20, the central zone heater 30, the outer circumferential zone heater 40, the first elemental wire portion 41, the second elemental wire portion 42, and a hollow shaft 50.

The ceramic substrate 20 is a disc-shaped plate formed of a ceramic material represented by, for example, aluminum nitride, silicon carbide, silicon nitride, or aluminum oxide. The thickness of the ceramic substrate 20 is, for example, 0.5 to 30 mm. A surface of the ceramic substrate 20 serves as a wafer placement surface 22. The wafer placement surface 22 may have a plurality of projections and a plurality of recesses formed by embossing or a plurality of grooves. The ceramic substrate 20 has a central portion 20a and an outer circumferential portion 20b. The central portion 20a is a circular region inside a virtual boundary 26, which is a circle concentric with the ceramic substrate 20. The outer circumferential portion 20b is an annular region outside the virtual boundary 26.

The central zone heater 30 is embedded in the central portion 20a of the ceramic substrate 20. The central zone heater 30 is a coil routed throughout the central portion 20a in a unicursal manner from a terminal 31 being one of a pair of terminals 31, 32 to the terminal 32 being the other of the terminals 31, 32 disposed near the center of the ceramic substrate 20. Both the terminals 31, 32 are connected to a power source for the central zone heater 35 through respective power feeding members 33, 34. The power source 35 is controlled by a controller 52. The central zone heater 30 is entirely formed by the coil from the one terminal 31 to the other terminal 32 (the coil is indicated by a bold line in FIG. 1). The number of turns of the coil per unit length may be appropriately changed in accordance with positions in the central portion 20a. For example, temperature variation may occur in the wafer due to partial variation of plasma heat input to the wafer. In order to eliminate this temperature variation, the number of turns per unit length may be changed in accordance with the positions. As the number of turns of the coil per unit length increases, the amount of heat generated by the coil is likely to increase, and the temperature is likely to increase. Instead of changing the number of turns of the coil, the diameter of winding or the distance between wires (distance between the adjacent coils) may be changed. Examples of the material of the coil include, for example, molybdenum, tungsten, a chemical compound of molybdenum/tungsten, and so forth. The power feeding members 33, 34 are preferably formed of metal, and more preferably formed of Ni. Examples of the shape of the power feeding members 33, 34 include a rod shape, a wire shape, and so forth. For connection between the terminals 31, 32 and the respective power feeding members 33, 34, for example, screwing, swaging, fitting, brazing, welding, eutectic soldering, or the like can be applied.

The outer circumferential zone heater 40 is embedded in the outer circumferential portion 20b of the ceramic substrate 20. The outer circumferential zone heater 40 is disposed in the same plane as a plane in which the central zone heater 30 is disposed. According to the present embodiment, the outer circumferential portion 20b has a single outer circumferential zone. Accordingly, the outer circumferential portion 20b is coincident with the outer circumferential zone. The outer circumferential zone heater 40 is a coil routed throughout the outer circumferential portion 20b in a unicursal manner from one end portion 40a to the other end portion 40b in the outer circumferential portion 20b. As is the case with the inner circumferential zone heater 30, the number of turns per unit length, the diameter of winding, or the distance between wires (distance between the adjacent coils) of this coil may also be appropriately changed in accordance with positions in the outer circumferential portion 20b. Examples of the material of the coil include, for example, molybdenum, tungsten, a chemical compound of molybdenum/tungsten, and so forth.

The first elemental wire portion 41 is a wire that extends from a first terminal 43 out of first and second terminals 43, 44 arranged in the central portion 20a of the ceramic substrate 20, passes through the central portion 20a, and is connected to the one end portion 40a of the outer circumferential zone heater 40. The first elemental wire portion 41 has a meandering shape (that is, winding shape) in plan view. The second elemental wire portion 42 is a wire that extends from the second terminal 44, passes through the central portion 20a, and is connected to the other end portion 40b of the outer circumferential zone heater 40. Also, the second elemental wire portion 42 has a meandering shape in plan view. Examples of the material of the wires include, for example, molybdenum, tungsten, a chemical compound of molybdenum/tungsten, and so forth. Although it is not particularly limited, the diameter of the wires is preferably, for example, greater than or equal to 0.3 mm but not greater than 1.0 mm. The first and second terminals 43, 44 are connected to a power source for the outer circumferential zone heater 47 through respective power feeding members 45, 46. The power source 47 is controlled by the controller 52. The power feeding members 45, 46 are preferably formed of metal, and more preferably formed of Ni. Examples of the shape of the power feeding members 45, 46 include a rod shape, a wire shape, and so forth. For connection between the terminals 43, 44 and the respective power feeding member 45, 46, for example, screwing, swaging, fitting, brazing, welding, eutectic soldering, or the like can be applied.

As illustrated in FIG. 3, the first and second elemental wire portions 41, 42 have respective parts Pa where the first and second elemental wire portions 41, 42 are close to each other, parts Pb where the first and second elemental wire portions 41, 42 are spaced from each other, and parts Pc where the first and second elemental wire portions 41, 42 are slightly close to each other. The first and second elemental wire portions 41, 42 are disposed close to each other so as to increase the heat generation amount at a position around the first and second elemental wire portions 41, 42 where a cool spot is likely to be generated by changes in a use environment. In contrast, the first and second elemental wire portions 41, 42 are spaced from each other so as to suppress the heat generation amount at a position around the first and second elemental wire portions 41, 42 where a hot spot is likely to be generated by changes in the use environment. The variation in temperature due to changes in the use environment can be recognized by a simulation or experiment. Accordingly, based on results of the simulation or experiment, the positions where the first and second elemental wire portions 41, 42 are to be disposed close to each other or spaced from each other can be determined in the design.

As illustrated in FIG. 3, the first and second elemental wire portions 41, 42 each have a plurality of curved portions. Here, the first elemental wire portion 41 has four curved portions. The curved portions have the respective radii of curvature of, from the first terminal 43 side, 5 mm, 30 mm, 9 mm, and 14 mm. The radii of curvature of the curved portions are preferably greater than or equal to 5 mm. Although the first elemental wire portion 41 and the second elemental wire portion 42 are symmetrically formed, this is not particularly limiting. The first elemental wire portion 41 and the second elemental wire portion 42 may have other shapes. Since the first and second elemental wire portions 41, 42 have the plurality of curved portions as described above, the heat generation amount around the first and second elemental wire portions 41, 42 can be finely varied compared to the case where the first elemental wire portion 41 and the second elemental wire portion 42 each have a single curved portion. For example, when the first and second elemental wire portion 41, 42 each have only a single curved portion, only a single position where the first and second elemental wire portions 41, 42 are disposed close to each other (or spaced from each other) is provided. However, when the first and second elemental wire portions 41, 42 each have a plurality of curved portions, a plurality of positions where the first and second elemental wire portions 41, 42 are disposed close to each other or spaced from each other can be provided. Thus, the temperature can be finely controlled.

The hollow shaft 50 is a cylindrical body formed of the same ceramic material as the material of the ceramic substrate 20 and integrally joined to a surface (rear surface) 24 of the ceramic substrate 20 opposite the wafer placement surface 22. The power feeding member 33, 34, 45, 46 are disposed inside the hollow shaft 50.

Such a multi-zone heater 10 can be manufactured pursuant to, for example, the method of manufacturing described in PTL 1. Accordingly, description of the method of manufacturing the multi-zone heater 10 is omitted herein.

Next, an example of use of the multi-zone heater 10 is described. Here, a process in which a semiconductor thin film is formed on a wafer by a plasma CVD with the multi-zone heater 10 is described. The multi-zone heater 10 is disposed in an enclosed chamber of a semiconductor manufacturing apparatus (not illustrated). The chamber is equipped with, for example, a gas supply port for supplying a material gas such as a silane gas and a vacuum port for discharging the gas from the chamber.

In the plasma CVD, first, a target temperature is set to 700° C. or less and the temperatures of the ceramic substrate 20 are controlled with the controller 52. The temperatures of the central portion 20a and the outer circumferential portion 20b of the ceramic substrate 20 are input from thermocouples (not illustrated) to the controller 52. The controller 52 adjusts the supply power to the central zone heater 30 and the outer circumferential zone heater 40 through the power sources 35, 47 so that the temperatures become the target temperature. Thus, the controller 52 controls the temperature of the ceramic substrate 20. Also, the chamber is evacuated, and the material gas is supplied into the chamber. Then, after the temperatures of the central portion 20a and the outer circumferential portion 20b of the ceramic substrate 20 have become substantially coincident with the target temperature, a wafer is placed on the wafer placement surface 22 of the ceramic substrate 20 while continuing the temperature control for the ceramic substrate 20. Since the temperature of the wafer itself is lower than the target temperature immediately after the placement of the wafer, the measured temperature reduces several ° C. However, the temperature increases again to the target temperature due to the temperature control performed by the controller 52. In this state, plasma is generated to form the semiconductor thin film from the material gas on the wafer.

Here, neither the first elemental wire portion 41 nor the second elemental wire portion 42 of the multi-zone heater 10 is a coil. The first elemental wire portion 41 and the second elemental wire portion 42 of the multi-zone heater 10 are elemental wires (that is, having a wire shape). Accordingly, the heat generation amount is small, and neither the first elemental wire portion 41 nor the second elemental wire portion 42 interfere with the temperature control for the central portion 20a of the ceramic substrate 20 with the central zone heater 30. Meanwhile, each of the first and second elemental wire portions 41, 42 has a meandering shape in plan view. Thus, the heat generation amount can be increased by forming the first and second elemental wire portions 41, 42 in a curved shape at a position where a cool spot is likely to be generated by the changes in the use environment, and the heat generation amount can be suppressed by forming the first and second elemental wire portions 41, 42 in a linear shape at a position where a hot spot is likely to be generated by changes in the use environment.

With the multi-zone heater 10 having been described, when the use environment is changed (for example, in such a case that the power ratio between the central zone heater 30 and the outer circumferential zone heater 40 is varied or the power supplied to both the zone heaters 30, 40 increases or reduces due to a change in a set temperature or other cases), generation of a cool spot or hot spot around the first and second elemental wire portions 41, 42 can be prevented.

Also, when the multi-zone heater 10 is used in an environment in which a heat cycle is repeatedly generated, the difference in thermal expansion occurs between the ceramic substrate 20 and the central and outer circumferential zone heaters 30, 40 embedded in the ceramic substrate 20. However, since the first and second elemental wire portions 41, 42 have a meandering shape, the difference in thermal expansion is absorbed. This reduces thermal stress generated at both ends of each of the first and second elemental wire portions 41, 42. Accordingly, the ceramic substrate 20 can be prevented from being damaged.

Furthermore, the first and second elemental wire portions 41, 42 have the parts where the first and second elemental wire portions 41, 42 are close to each other and the parts where the first and second elemental wire portions 41, 42 are spaced from each other. Thus, the first and second elemental wire portions 41, 42 can be disposed close to each other so as to increase the heat generation amount at a position where a cool spot is likely to be generated by changes in the use environment, and the first and second elemental wire portions 41, 42 can be spaced from each other so as to suppress the heat generation amount at a position where a hot spot is likely to be generated by changes in the use environment. This further facilitates prevention of generation of a cool spot or hot spot due to changes in the use environment.

Furthermore, the first and second elemental wire portions 41, 42 each have the plurality of curved portions. Thus, the heat generation amount around each of the elemental wire portions 41, 42 can be finely varied compared to the case where the elemental wire portions 41, 42 each have a single curved portion.

The present invention is not limited to the above-described embodiments, and can be carried out by various modes as long as they belong to the technical scope of the invention.

Figure 4:
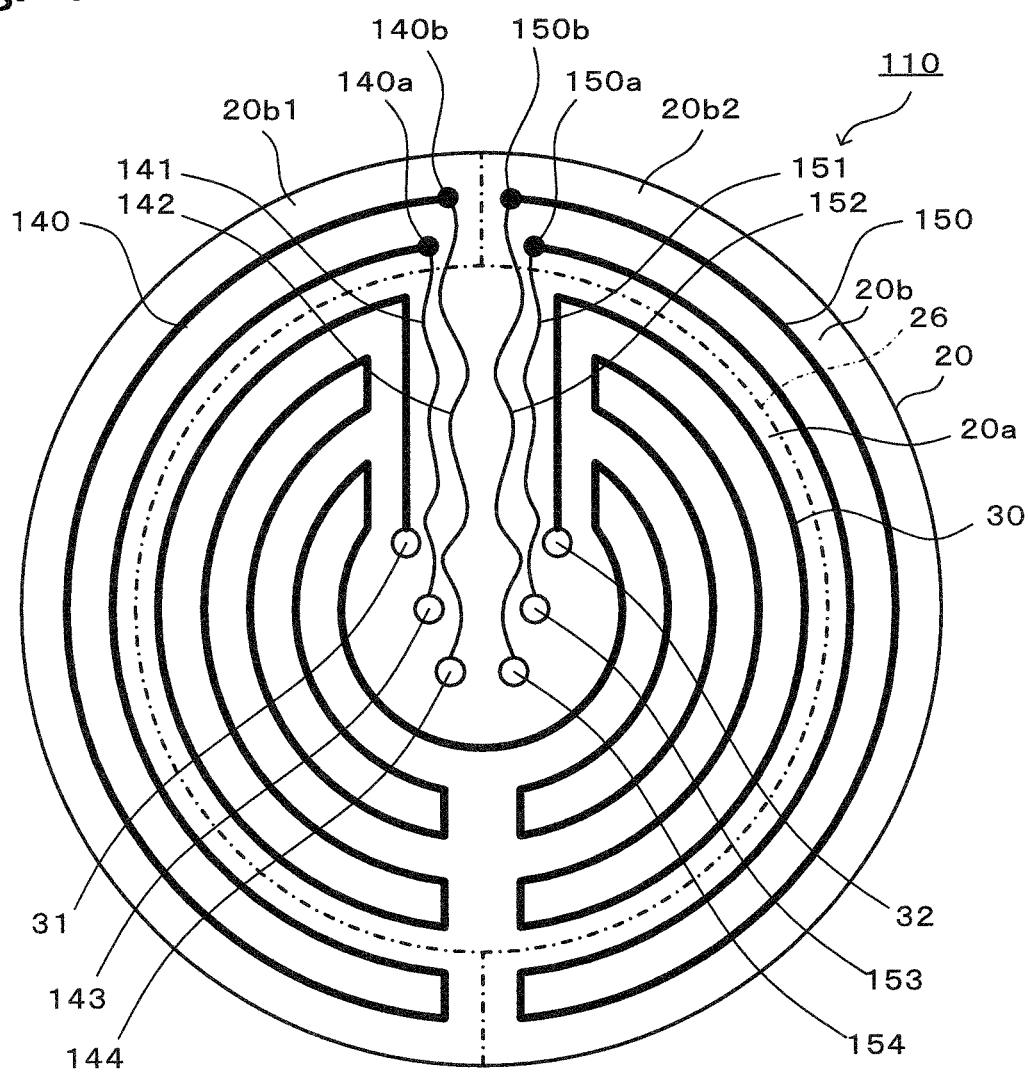
FIG. 4 is a plan view of a multi-zone heater 110.

For example, according to the above-described embodiment, the example in which the outer circumferential portion 20b of the ceramic substrate 20 has a single outer circumferential zone is described. However, the outer circumferential portion 20b may have a plurality of the outer circumferential zones. FIG. 4 is a plan view of a multi-zone heater 110 provided with two outer circumferential zones (first and second outer circumferential zones 20b1, 20b2) in an annular outer circumferential portion 20b. In FIG. 4, the same elements as those of the above-described embodiment are denoted by the same reference signs, thereby omitting description thereof.

A first outer circumferential zone heater 140 is provided in the first outer circumferential zone 20b1 having a semi-annular shape so as to be disposed in the same plane as the plane in which the central zone heater 30 is disposed. The first outer circumferential zone heater 140 is a coil routed throughout the first outer circumferential zone 20b1 in a unicursal manner from one end portion 140a to the other end portion 140b in the first outer circumferential zone 20b1. A first elemental wire portion 141 is a wire that extends from a first terminal 143 out of first and second terminals 143, 144 disposed in the central portion 20a of the ceramic substrate 20, passes through the central portion 20a, and is connected to the one end portion 140a of the first outer circumferential zone heater 140. The first elemental wire portion 141 has a meandering shape in plan view. A second elemental wire portion 142 is a wire that extends from the second terminal 144, passes through the central portion 20a, and is connected to the other end portion 140b of the first outer circumferential zone heater 140. The second elemental wire portion 142 has a meandering shape in plan view.

A second outer circumferential zone heater 150 is provided in the second outer circumferential zone 20b2 having a semi-annular shape so as to be in the same plane as the plane in which the central zone heater 30 is disposed. The second outer circumferential zone heater 150 is a coil routed throughout the second outer circumferential zone 20b2 in a unicursal manner from one end portion 150a to the other end portion 150b in the second outer circumferential zone 20b2. A first elemental wire portion 151 is a wire that extends from a first terminal 153 out of first and second terminals 153, 154 disposed in the central portion 20a of the ceramic substrate 20, passes through the central portion 20a, and is connected to the one end portion 150a of the second outer circumferential zone heater 150. The first elemental wire portion 151 has a meandering shape in plan view. A second elemental wire portion 152 is a wire that extends from the second terminal 154, passes through the central portion 20a, and is connected to the other end portion 150b of the second outer circumferential zone heater 150. The second elemental wire portion 152 has a meandering shape in plan view.

Also with the multi-zone heater 110 illustrated in FIG. 4, effects similar to those of the above-described embodiment are obtained. Furthermore, the outer circumferential portion 20b is divided into the first and second outer circumferential zones 20b1, 20b2, the first outer circumferential zone heater 140 is provided in the first outer circumferential zone 20b1, and the second outer circumferential zone heater 150 is provided in the second outer circumferential zone 20b2. Accordingly, compared to the above-described embodiment, fineness of the temperature control for the outer circumferential portion 20b of the ceramic substrate 20 can be increased.

Figure 5:
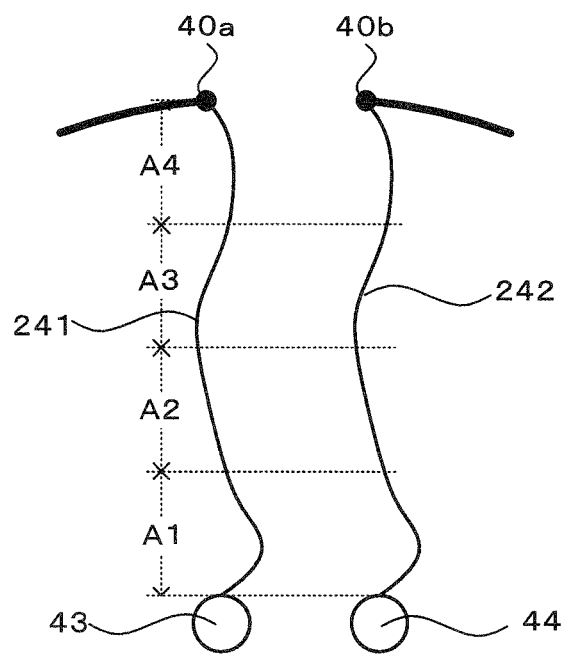
FIG. 5 is an explanatory view of first and second elemental wire portions 241, 242.

Instead of the first and second elemental wire portions 41, 42 according to the above-described embodiment, first and second elemental wire portions 241, 242 illustrated in FIG. 5 may be adopted. The first elemental wire portion 241 is the same as the first elemental wire portion 41. The second elemental wire portion 242 is provided so as to be parallel to the first elemental wire portion 241. In this case, when a region around the first and second elemental wire portions 241, 242 is divided into four sections A1 to A4 of equal length, the radius of curvature in curved portions of the first and second elemental wire portions 241, 242 is smaller in the section A1 than in the other sections A2 to A4. Thus, the length of the elemental wires is greater in the section A1 than in the other sections A2 to A4. Accordingly, the heat generation amount is greater in the section A1 than in the other sections A2 to A4. This feature is similarly to the above-described embodiment. Also, for example, when the sections A3 and A4 are compared, regions heated by the first and second elemental wire portions 241, 242 are located, in FIG. 5, toward the left in the section A3 and toward the right in the section A4.

Although the central zone heater 30 and the outer circumferential zone heater 40 have coil shapes according to the above-described embodiment, this is not limiting. For example, these may have a mesh shape. For varying the density of a mesh-shaped heating element, for example, the fineness of holes, the wire diameter, or the area of the heating element can be changed.

According to the above-described embodiment, electrostatic electrodes for an electrostatic chuck or a high-frequency electrode for generating plasma may be further embedded in the ceramic substrate 20. The central zone heater 30 and the outer circumferential zone heater 40 may be provided on the surface of the ceramic substrate 20 instead of being embedded in the ceramic substrate 20.

According to the above-described embodiment, the diameter of the wires of the first and second elemental wire portions 41, 42 may be greater than the wire diameter of the coils (the same material as that of the wire) of the central and outer circumferential zone heaters 30, 40. That is, the sectional area of the wires may be greater than the sectional area of the coils. In this way, the resistance per unit length of the first and second elemental wire portions 41, 42 is smaller than the resistance per unit length of the outer circumferential zone heater 40. Accordingly, the heat generation amount per unit length of the first and second elemental wire portions 41, 42 can be smaller than the heat generation amount per unit length of the central and outer circumferential zone heaters 30, 40.

The present application claims priority of Japanese Patent Application No. 2018-55520 filed on Mar. 23, 2018, the entire contents of which are incorporated herein by reference.

What is claimed is:

1. A multi-zone heater, comprising:
 a disc-shaped ceramic substrate that has a wafer placement surface;
 a coil-shaped or mesh-shaped central zone heater provided in a central portion of the ceramic substrate;
 at least one coil-shaped or mesh-shaped outer circumferential zone heater that is provided so as to correspond to at least one outer circumferential zone in an outer circumferential portion of the ceramic substrate in a same plane as a plane in which the central zone heater is disposed and that is routed throughout the at least one outer circumferential zone in a unicursal manner from one end portion to the other end portion in the at least one outer circumferential zone;
 a first elemental wire portion that extends from a first terminal disposed in the central portion of the ceramic substrate, that passes through the central portion, that is connected to the one end portion of the at least one outer circumferential zone heater, and that has a meandering shape in plan view and a plurality of curved portions; and
 a second elemental wire portion that extends from a second terminal disposed in the central portion of the ceramic substrate, that passes through the central portion, that is connected to the other end portion of the at least one outer circumferential zone heater, and that has a meandering shape in plan view and a plurality of curved portions,
 wherein the first elemental wire portion and the second elemental wire portion are parallel to each other, and
 a heat generation amount in a section with a small radius of curvature in curved portions of the first and the second elemental wire portions is greater than a heat generation amount in a section with a large radius of curvature in curved portions of the first and the second elemental wire portions.

2. The multi-zone heater according to claim 1, wherein the at least one outer circumferential zone includes a plurality of outer circumferential zones in the outer circumferential portion of the ceramic substrate.

3. The multi-zone heater according to claim 1, wherein resistance per unit length of the first elemental wire portion and the second elemental wire portion is smaller than resistance per unit length of the at least one outer circumferential zone heater.

4. The multi-zone heater according to claim 1, wherein the curved portions of the first elemental wire portion and the second elemental wire portion have radii of curvature greater than or equal to 5 mm.

5. The multi-zone heater according to claim 1, wherein the curved portions of the first and the second elemental wire portions have different radii or curvature respectively.

6. A multi-zone heater, comprising:
 a disc-shaped ceramic substrate that has a wafer placement surface;
 a coil-shaped or mesh-shaped central zone heater provided in a central portion of the ceramic substrate;
 at least one coil-shaped or mesh-shaped outer circumferential zone heater that is provided so as to correspond to at least one outer circumferential zone in an outer circumferential portion of the ceramic substrate in a same plane as a plane in which the central zone heater is disposed and that is routed throughout the at least one outer circumferential zone in a unicursal manner from one end portion to the other end portion in the at least one outer circumferential zone;
 a first elemental wire portion that extends from a first terminal disposed in the central portion of the ceramic substrate, that passes through the central portion, that is connected to the one end portion of the at least one outer circumferential zone heater, and that has a meandering shape in plan view and a plurality of curved portions; and
 a second elemental wire portion that extends from a second terminal disposed in the central portion of the ceramic substrate, that passes through the central portion, that is connected to the other end portion of the at least one outer circumferential zone heater, and that has a meandering shape in plan view and a plurality of curved portions,
 wherein the first elemental wire portion and the second elemental wire portion have respective parts where the first elemental wire portion and the second elemental wire portion are close to each other, and the first elemental wire portion and the second elemental wire portion have respective parts where the first elemental wire portion and the second elemental wire portion are spaced from each other, a distance between the first elemental wire portion and the second elemental wire portion in the part where the first elemental wire portion and the second elemental wire portion are close to each other is smaller than a distance between the first elemental wire portion and the second elemental wire portion in the part where the first elemental wire portion and the second elemental wire portion are spaced from each other, and a heat generation amount in the part where the first elemental wire portion and the second elemental wire portion are close to each other is greater than a heat generation amount in the part where the first elemental wire portion and the second elemental wire portion are spaced from each other.

7. The multi-zone heater according to claim 6, wherein the at least one outer circumferential zone includes a plurality of outer circumferential zones in the outer circumferential portion of the ceramic substrate.

8. The multi-zone heater according to claim 6, wherein resistance per unit length of the first elemental wire portion and the second elemental wire portion is smaller than resistance per unit length of the at least one outer circumferential zone heater.

* * * * *